US011270746B2

(12) United States Patent
Kim

(10) Patent No.: US 11,270,746 B2
(45) Date of Patent: Mar. 8, 2022

(54) WORD LINE DRIVER CIRCUITRY, AND ASSOCIATED METHODS, DEVICES, AND SYSTEMS

(71) Applicant: Micron Technology, Inc., Boise, ID (US)

(72) Inventor: Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 16/548,242

(22) Filed: Aug. 22, 2019

(65) Prior Publication Data

US 2021/0057009 A1  Feb. 25, 2021

(51) Int. Cl.
*G11C 8/08* (2006.01)
*G11C 8/14* (2006.01)
*G11C 11/408* (2006.01)

(52) U.S. Cl.
CPC .................. *G11C 8/08* (2013.01); *G11C 8/14* (2013.01); *G11C 11/4085* (2013.01)

(58) Field of Classification Search
CPC .......... G11C 8/08; G11C 8/14; G11C 11/4085
See application file for complete search history.

(56) References Cited

U.S. PATENT DOCUMENTS

| | | | |
|---|---|---|---|
| 7,764,567 B2 | 7/2010 | Uedo | |
| 9,299,406 B2 | 3/2016 | Venkata | |
| 2012/0113740 A1* | 5/2012 | Lee | G11C 16/08 365/230.06 |
| 2017/0062035 A1* | 3/2017 | Antonyan | G11C 13/0038 |

OTHER PUBLICATIONS

Kim, Tae H., U.S. Appl. No. 167,339,235, dated Main Word Line Driver Circuit, filed Apr. 30, 2019.

* cited by examiner

*Primary Examiner* — Mohammed A Bashar
(74) *Attorney, Agent, or Firm* — TraskBritt

(57) ABSTRACT

A word line driver circuit is disclosed. A word line driver circuit may include a circuit configured to generate a clamped voltage based on a first fixed supply voltage and in response to receipt of a first control signal triggering an active mode. The circuitry may further be configured to generate an internal global word line voltage based on the clamped voltage during the active mode. Further, the word line driver circuit may include at least one main word line driver configured to receive the internal global word line voltage and generate a global word line voltage. Additionally, the word line driver circuit may include at least one sub word line driver configured to receive the global word line voltage and generate a word line voltage.

20 Claims, 11 Drawing Sheets

WORD LINE DRIVER CIRCUITRY, AND ASSOCIATED METHODS, DEVICES, AND SYSTEMS

TECHNICAL FIELD

Embodiments of the disclosure relate to circuitry for generating word line voltages. More specifically, various embodiments relate to word line driver circuitry configured such that one or more generated word line voltages may decrease during a row active time, and to related methods, memory devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Memory devices typically include many memory cells that are capable of holding a charge that is representative of a bit of data. Typically, these memory cells are arranged in a memory array. Data may be written to or retrieved from a memory cell by selectively activating the memory cell via an associated word line driver.

DETAILED DESCRIPTION

Memory typically includes many memory cells arranged in a two-dimensional array of intersecting rows and columns. Data is written to or retrieved from the memory cells by selectively by applying activation voltages to word lines (i.e., access lines) and bit lines (i.e., data lines). In general, word lines activate memory cells and bit lines provide data to or retrieve data from the activated memory cells.

When memory access is desired, an activation voltage may be applied to a word line by a word line driver to enable a desired function (e.g., read or write) to be performed. More particularly, when an activation voltage (e.g., a high voltage) is applied via a word line, circuitry (e.g., a passgate transistor) in a memory cell may enable a bit line to write data to or retrieve data from the activated memory cell. When memory access is not needed, the word line driver may apply a deactivation voltage (e.g., a low voltage or ground voltage).

In various embodiments described herein, a memory device may include a word line driver circuit configured such that at least one word line voltage (e.g., an internal global word line driver voltage, a global word line voltage, and/or a word line voltage) may decrease during an active mode (i.e., a row active time), assuming the active mode has a sufficient duration. Therefore, a voltage applied to one or more components of the word line driver circuit may be reduced. Accordingly, reliability of the one or more components (e.g., transistors) (i.e., that may receive the at least one word line voltage) may be increased. More specifically, various embodiments may reduce non-conducting stress of one or more transistors (e.g., NMOS) transistors of word line driver circuitry, thus improving the reliability of the word line driver circuitry.

Figure 1:
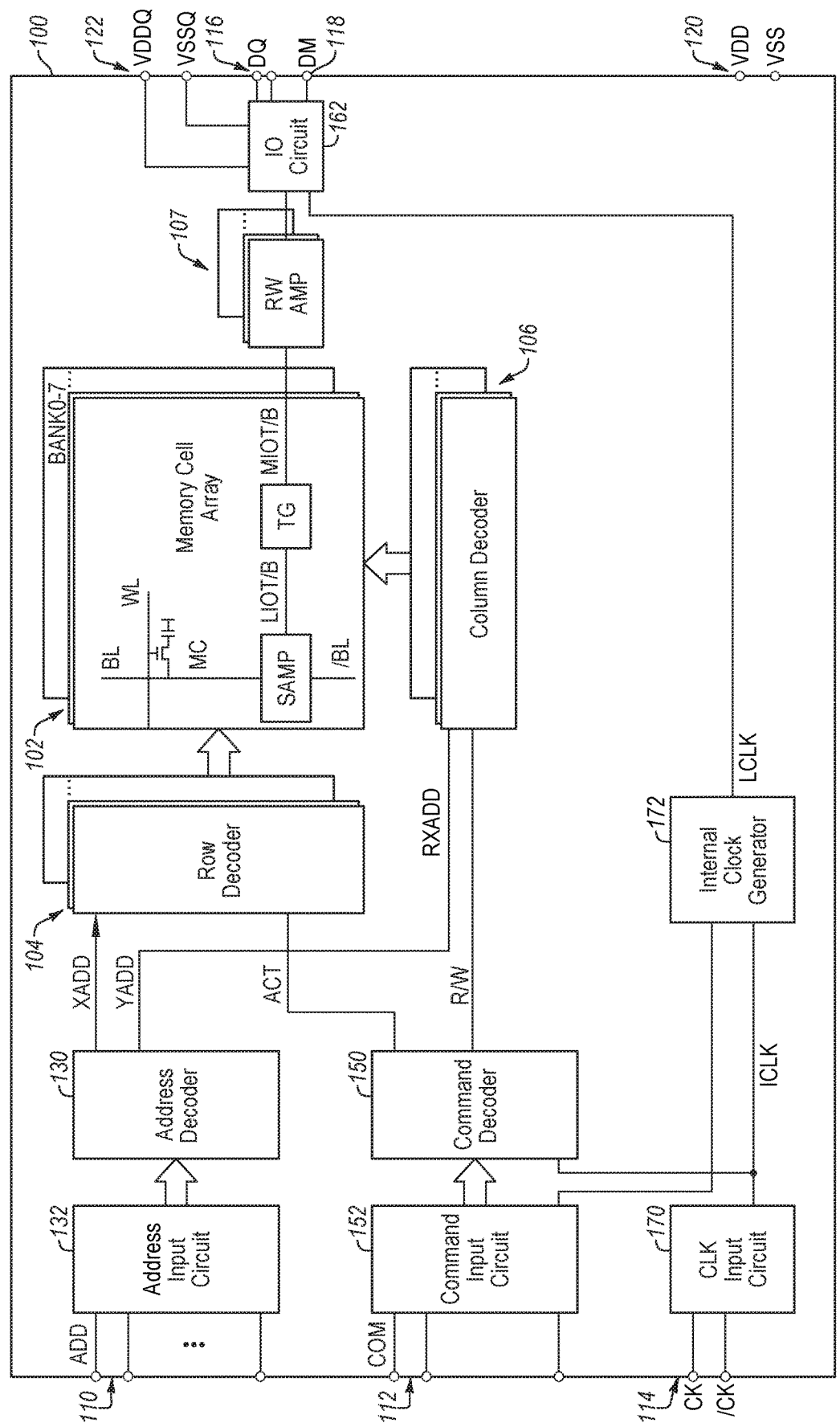
FIG. 1 is a block diagram of an example memory device, according to various embodiments of the present disclosure.

FIG. 1 includes a block diagram of an example memory device 100, according to various embodiments of the present disclosure. Memory device 100 may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory array 102.

In the embodiment of FIG. 1, memory array 102 is shown as including eight memory banks BANK0-7. More or fewer banks may be included in memory array 102 of other embodiments. Each memory bank includes a number of access lines (word lines WL), a number of data lines (bit lines BL) and/BL, and a number of memory cells MC arranged at intersections of the number of word lines WL and the number of bit lines BL and/BL. The selection of a word line WL may be performed by a row decoder 104 and the selection of the bit lines BL and/BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and/BL are coupled to a respective sense amplifier SAMP. Read data from bit line BL or/BL may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or/BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active command ACT, a write signal, a row address XADD, and a column address YADD, write data may be supplied to memory array 102 via data terminal 116, input/output circuit 162, read/write amplifier 107, transfer gate TG, and sense amplifier SAMP. The write data may be written to memory cell MC specified by row address XADD and column address YADD.

Clock signals CK and/CK may be received via clock terminals 114. A clock input circuit 170 may generate internal clock signals ICLK based on clock signals CK and ICK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

Figure 2:
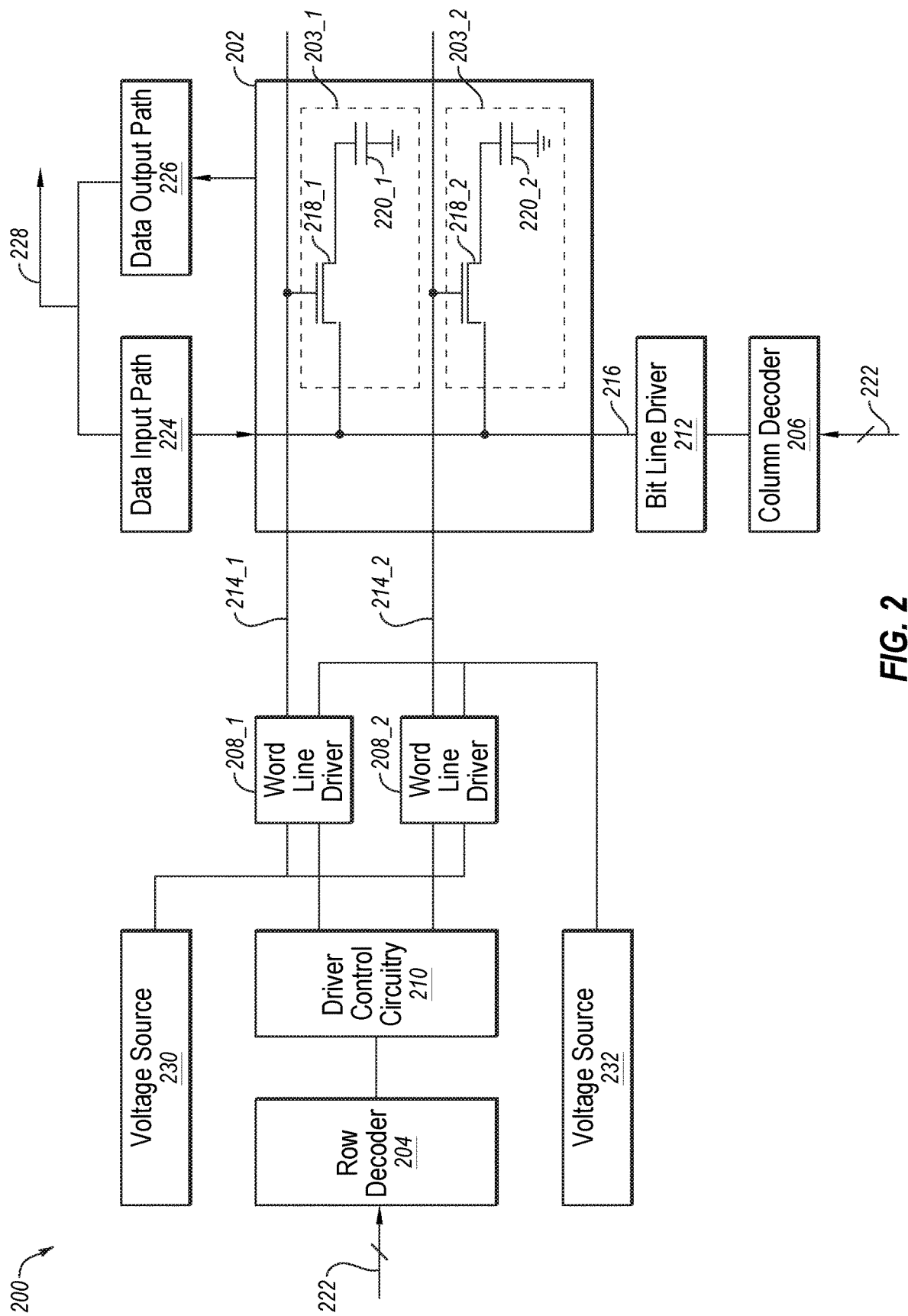
FIG. 2 is another, more specific block diagram of an example memory device, according to various embodiments of the present disclosure.

FIG. 2 depicts another, more specific block diagram of an example memory device 200, according to various embodiments of the present disclosure. Memory device 200, which may be part of memory device 100 of FIG. 1, includes a memory cell array 202 (e.g., memory cell array 102 of FIG. 1) with memory cells 203 arranged side-by-side, a row decoder 204 (e.g., row decoder 104 of FIG. 1) and a column decoder 206 (e.g., column decoder 106 of FIG. 1). Memory device 200 further includes word line driver circuitry including word line drivers 208 and driver control circuitry 210. Memory device 200 also includes a bit line driver 212. Memory device 200 further includes word lines 214 and a bit line 216 disposed adjacent to the rows and columns of memory cells 203.

It is understood that a memory array (e.g., memory cell array 202 in FIG. 2) typically includes a number of memory cells arranged in rows and columns; however, for simplicity, only two such memory cells (i.e., memory cells 203_1 and memory cell 203_2) are shown in FIG. 2. Similarly, it will be understood that a memory device (e.g., memory device 200) may generally include any number of word line drivers, any number of word lines, and any number bit lines; however, for simplicity, only two word line drivers (e.g., word line driver 208_1 and word line driver 208_2), two word lines (i.e., word line 214_1 and word line 214_2) and one bit line (i.e., bit line 216) are shown in FIG. 2.

As will be appreciated, each memory cell 203 includes a passgate transistor 218 having its gate connected to an associated word line 214, its drain connected to bit line 216, and its source connected to an associated capacitor 220. Each word line 214 is driven by an associated word line driver 208 and each bit line 216 is driven by bit line driver 212.

Row decoder 204 and a column decoder 206 may be configured to decode address signals on address lines 222 to access memory cells 203. Data may be provided to memory cells 203 via a data input path 224, and data may be retrieved from memory cells 203 via a data output path 226. Data being transmitted to and from data input path 224 and data output path 226 may be carried on data lines 228.

Each word line driver 208 may be controlled by driver control circuitry 210, which may receive signals (i.e., from row decoder 204) that indicate which word line drivers 208 should apply activation voltages to word lines 214, and which word line drivers 208 should apply deactivation voltages to word lines 214.

According to some embodiments, in an active mode (e.g., also referred to herein as a "row active mode," an "active phase," or an "active period"), driver control circuitry 210 conveys a high (e.g., a logic high state) signal to word line driver 208_1, and word line driver 208_1 may apply an activation voltage to word line 214_1 (and any other word lines that word line driver 208_1 is driving). The activation voltage (e.g., a supply voltage $V_{CCP}$) may be provided by a voltage source 230 (also be referred to herein as a "high voltage source"), which is coupled to word line driver 208_1. The activation voltage may be applied to word line 214_1 to perform a memory access function (e.g., read or write function) on associated memory cell 203_1. More specifically, for example, the activation voltage may activate passgate transistor 218_1 to enable data transfer between memory cell 203_1 and data paths 224 and 226.

In a standby mode (also referred to herein as a "standby phase," a "pre-charge mode" or a "pre-charge phase") (e.g., when no memory access function is being performed), word line driver 208_1 may apply a deactivation voltage to word line 214_1. The deactivation voltage (e.g., a ground voltage or a negative voltage) may be provided by a voltage source 232 (also be referred to herein as a "low voltage source"), which is coupled to word line driver 208_1. The application of a deactivation voltage may turn passgate transistor 218_1

OFF, thereby preventing any memory access function from being performed on memory cell 203_1.

Alternatively, in some embodiments, driver control circuitry 210 may cause word line driver 208_1 to apply an activation voltage (i.e., provided by voltage source 232) to word line 214_1. As such, the activation voltage (e.g., a ground voltage, low positive voltage, or a negative voltage) may activate passgate transistor 218_1 (e.g., a PMOS transistor) to enable data transfer between memory cell 203_1 and data paths 224 and 226. Additionally, in some embodiments, driver control circuitry 210 may cause word line driver 208_1 to apply a deactivation voltage (i.e., provided by voltage source 230) to word line 214_1. As such, the deactivation voltage (e.g., voltage Vccp) may turn passgate transistor 218_1 (e.g., a PMOS transistor) OFF, thereby preventing any memory access function from being performed on memory cell 212.

Figure 3A:
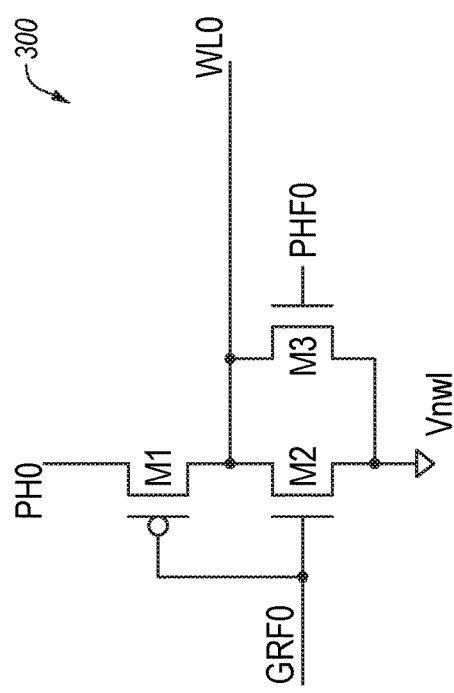
FIG. 3A depicts a conventional sub word line driver.

FIG. 3A depicts a conventional sub word line driver 300 including p-channel metal-oxide-semiconductor (PMOS) transistor M1 and n-channel metal-oxide-semiconductor (NMOS) transistors M2 and M3. As shown in FIG. 3A, a drain of transistor M1 is configured to receive a phase signal PH0, a source of transistor M1 is coupled to a word line WL0, and a gate of transistor M1 is configured to receive a global word line voltage GRF0. Further, a source of transistor M2 is coupled to word line WL0, a drain of transistor M2 is configured to receive a negative word line voltage Vnw1, and a gate of transistor M1 is configured to receive global word line control signal GRF0. Further, a source of transistor M3 is coupled to word line WL0, a drain of transistor M3 is configured to receive negative word line voltage Vnw1, and a gate of transistor M3 is configured to receive a phase signal PHF0 (i.e., a complement of phase signal PH0).

Figure 3B:
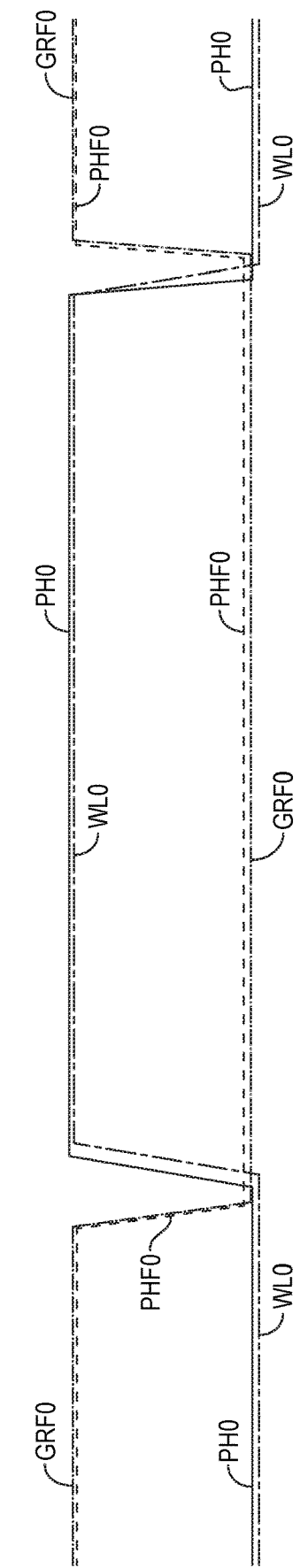
FIG. 3B depicts a timing diagram associated with sub word line driver shown in FIG. 3A.

FIG. 3B depicts a timing diagram 310 associated with sub word line driver circuit 300 shown in FIG. 3A. As shown in timing diagram 310, when global word line voltage GRF0 and phase signal PHF0 are high (e.g., at 3.3 volts), transistor M1 is OFF, transistors M2 and M3 are ON, and word line WL0 is at negative word line voltage Vnw1 (e.g., 0.2 volts). Further, when global word line voltage GRF0 and phase signal PHF0 transition from high to low, transistor M1 turns ON, transistors M2 and M3 turn OFF, and thus a voltage of word line WL0 is equal to a voltage of phase signal PH0, which is also high (e.g., at 3.3 volts).

Figure 4:
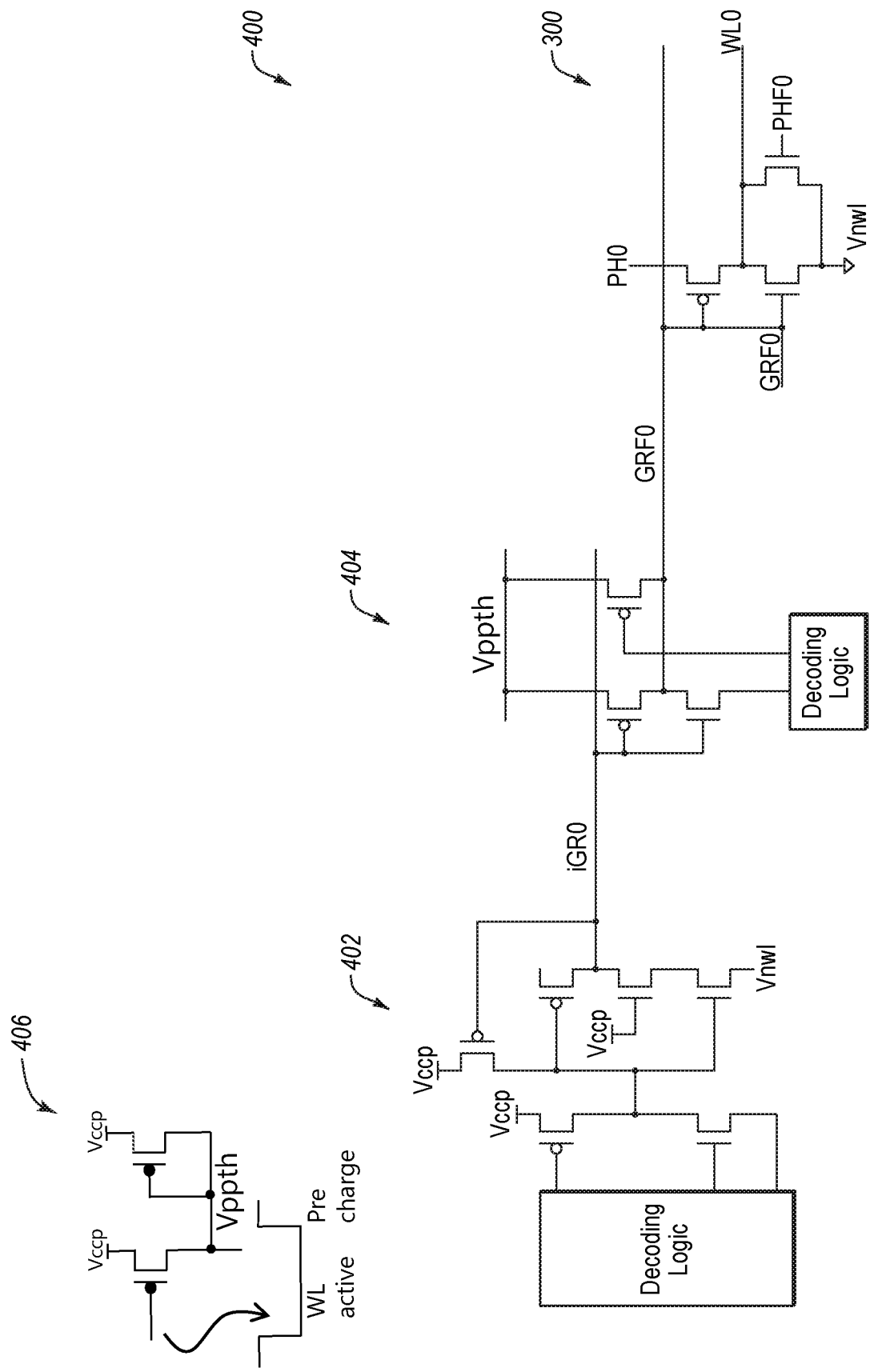
FIG. 4 illustrates a conventional word line driver circuit including a pre-decoder, a main word line driver, and a sub word line driver.

FIG. 4 illustrates a conventional word line driver circuit 400 including a pre-decoder 402, a main word line driver 404, a circuit 406 for generating a voltage Vppth, and sub word line driver 300. As will be appreciated, pre-decoder 402 is configured to generate an internal global word line voltage iGR0, which may be received at main word line driver 404. Further, main word line driver 404 may generate and convey a global word line voltage GRF0 to sub word line driver 300, which may generate a voltage on word line WL.

With reference to FIGS. 3A and 4, as will be appreciated, while sub word line driver 300 is selected (i.e., in an active state), a voltage at word line WL0 will be equal to supply voltage Vccp (e.g., 3.3 volts). Further, gates of transistors M1 and M2 (see FIG. 3A) are configured to receive global word line voltage GRF0, and thus sub word line driver 300 may suffer from gate-induced drain-leakage (GIDL), as will be appreciated by a person having ordinary skill in the art. Also, sub word line driver 300 has poor pulling speed in word line WL0 (i.e., compared to sub word line driver circuit 500 shown in FIG. 5A) since sub word line driver 300 has PMOS transistor M1 compared to sub word line driver circuit 500 that includes transistors M4 and M6.

Figure 5A:
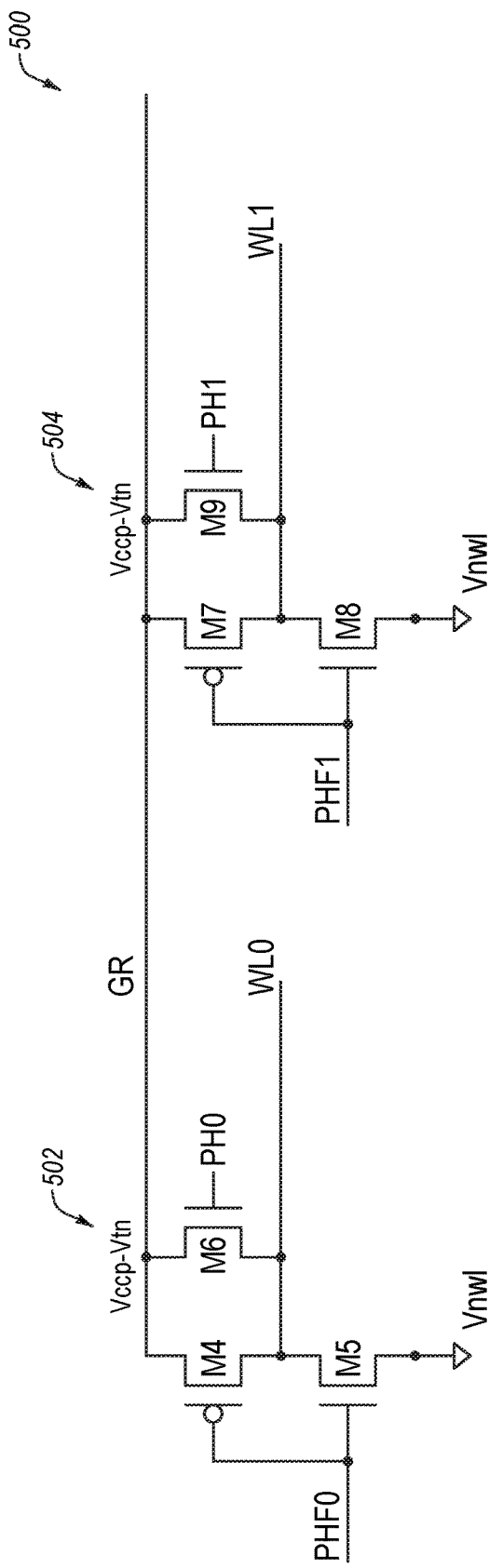
FIG. 5A illustrates an example sub word line driver, in accordance with various embodiments of the present disclosure.

FIG. 5A illustrates an example sub word line driver circuit 500, in accordance with various embodiments of the present disclosure. Sub word line driver circuit 500 includes a sub word line driver 502 and a sub word line driver 504. Each of sub word line driver 502 and sub word line driver 504 may also referred to herein as a "mux style sub word line driver."

Sub word line driver 502, which is coupled to a word line WL0, includes transistors M4-M6. In this illustrated embodiment, transistor M4 is a PMOS transistor, and transistors M5 and M6 are NMOS transistors. Further, sub word line driver 504, which is coupled to a word line WL1, includes transistors M7-M9. In this illustrated embodiment, transistor M7 is a PMOS transistor, and transistors M8 and M9 are NMOS transistors.

With specific reference to sub word line driver 502, a drain of transistor M4 is configured to receive a global word line voltage GR, a source of transistor M4 is coupled to a word line WL0, and a gate of transistor M4 is configured to receive a phase signal PHF0. Further, a source of transistor M5 is coupled to word line WL0, a drain of transistor M5 is configured to receive a negative word line voltage Vnw1 (e.g., 0.2 volts), and a gate of transistor M5 is configured to receive phase signal PHF0. In addition, a source of transistor M6 is coupled to global word line voltage GR, a drain of transistor M6 is coupled to word line WL0, and a gate of transistor M6 is configured to receive a phase signal PH0 (i.e., a complement of phase signal PHF0).

Further, with specific reference to sub word line driver 504, a drain of transistor M7 is configured to receive a global word line voltage GR, a source of transistor M7 is coupled to a word line WL1, and a gate of transistor M7 is configured to receive a phase signal PHF1. Further, a source of transistor M8 is coupled to word line WL1, a drain of transistor M5 is configured to receive negative word line voltage Vnw1, and a gate of transistor M8 is configured to receive phase signal PHF1. Further, a source of transistor M9 is coupled to global word line voltage GR, a drain of transistor M6 is coupled to word line WL1, and a gate of transistor M6 is configured to receive a phase signal PH1 (i.e., a complement of phase signal PHF1).

In an example operation wherein sub word line driver circuit 500 is in an active mode, sub word line driver 502 may be in an active state (i.e., word line WL0 is selected), and sub word line driver 504 may be in an inactive state (i.e., word line WL1 is not selected). In this example operation, phase signal PHF0 is low (e.g., at 0.2 volts), phase signal PH0 is high (e.g., at 3.3 volts), transistors M4 and M6 are ON, transistor M5 is OFF, and thus word line WL0 is at a high voltage. Further, in this example operation, phase signal PHF1 is high (e.g., at 3.3 volts), phase signal PH1 is low (e.g., at 0.2 volts), transistors M7 and M9 are OFF, transistor M8 is ON and thus word line WL1 is at a low voltage (e.g., 0.2 volts).

As will be appreciated, while sub word line driver 504 is in an inactive state (i.e., word line WL1 is not selected), NMOS transistor M9 may degrade due to non-conducting stress. However, as described more fully herein and in accordance with various embodiments of the disclosure, global word line voltage GR that is conveyed to source of transistor M9 may decrease, and thus the non-conducting stress applied to transistor M9 may be mitigated.

Figure 5B:
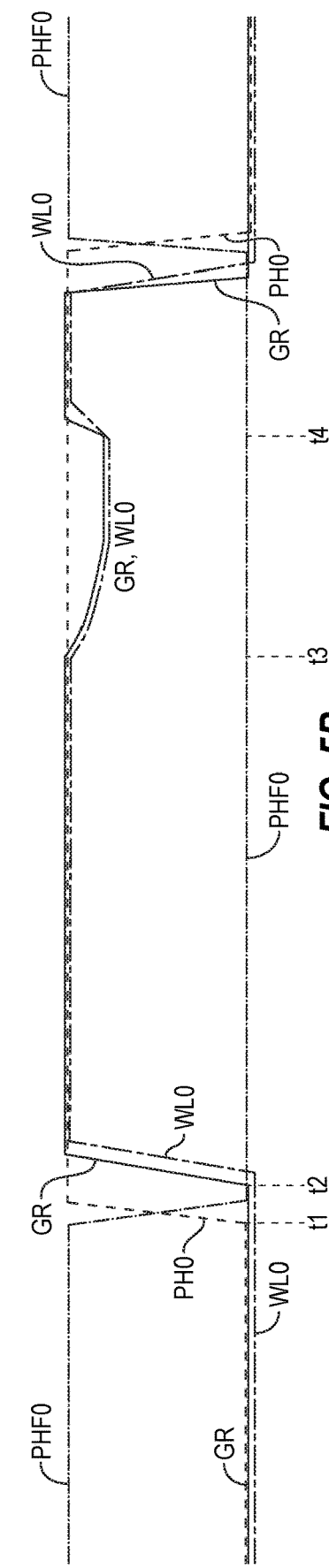
FIG. 5B depicts a timing diagram associated with sub word line driver shown in FIG. 5A.

FIG. 5B depicts a timing diagram 510 associated with sub word line driver circuit 500 shown in FIG. 5A. As shown in timing diagram 510, at a time t1 (e.g., in response to an active command), phase signal PHF0 may begin to transition low and phase signal PH0 may begin to transition high. Further, at a time t2, to initiate an active mode, global word line voltage GR begins to transition high, thus causing word line voltage WL0 to transition high. Further, according to various embodiments of the disclosure described more fully below, during the active mode and at a subsequent time t3, global word line voltage GR decreases, and thus word line voltage WL0 also decreases (e.g., to Vccp−Vt). The reduction of the voltage of global word line voltage GR, which is at least partially due to energy leakage in word line driver circuitry (e.g., a pre-decoder, one or more main word line drivers, and/or one or more sub word line drivers), may reduce the non-conducing stress applied to a transistor (e.g., transistor M9) of an inactive word line driver (e.g., word line driver 504). More specifically, for example, in an active mode wherein sub word line driver 502 is selected and sub word line driver 504 is unselected, current leakage in non-conducting transistor M7 and/or non-conducting transistor M9 may contribute to a reduction of global word line voltage GR. Alternatively or additionally, leakage associated with one or more memory cells coupled to active word line WL0 may contribute to a reduction of global word line voltage GR0. A time duration between time t2 and t3 is a time delay (also referred to herein as an "internal delay") between an active mode being triggered (i.e., in response to an active command) and reduction in global word line voltage GR.

With continued reference to timing diagram 510, at a time t4, a pre-charge command may be issued (i.e., thus ending the active mode (e.g., ending the word line activation cycle)), and global word line voltage GR and word line voltage WL0 may return to voltage Vccp (also referred to herein as a "pumped voltage" or a "supply voltage"). It is noted that in some embodiments, if a pre-charge signal occurs prior to time t3 (i.e., if the active mode is not of sufficient duration), global word line voltage GR and word line voltage WL0 may not decrease during the associated active mode.

Figure 6:
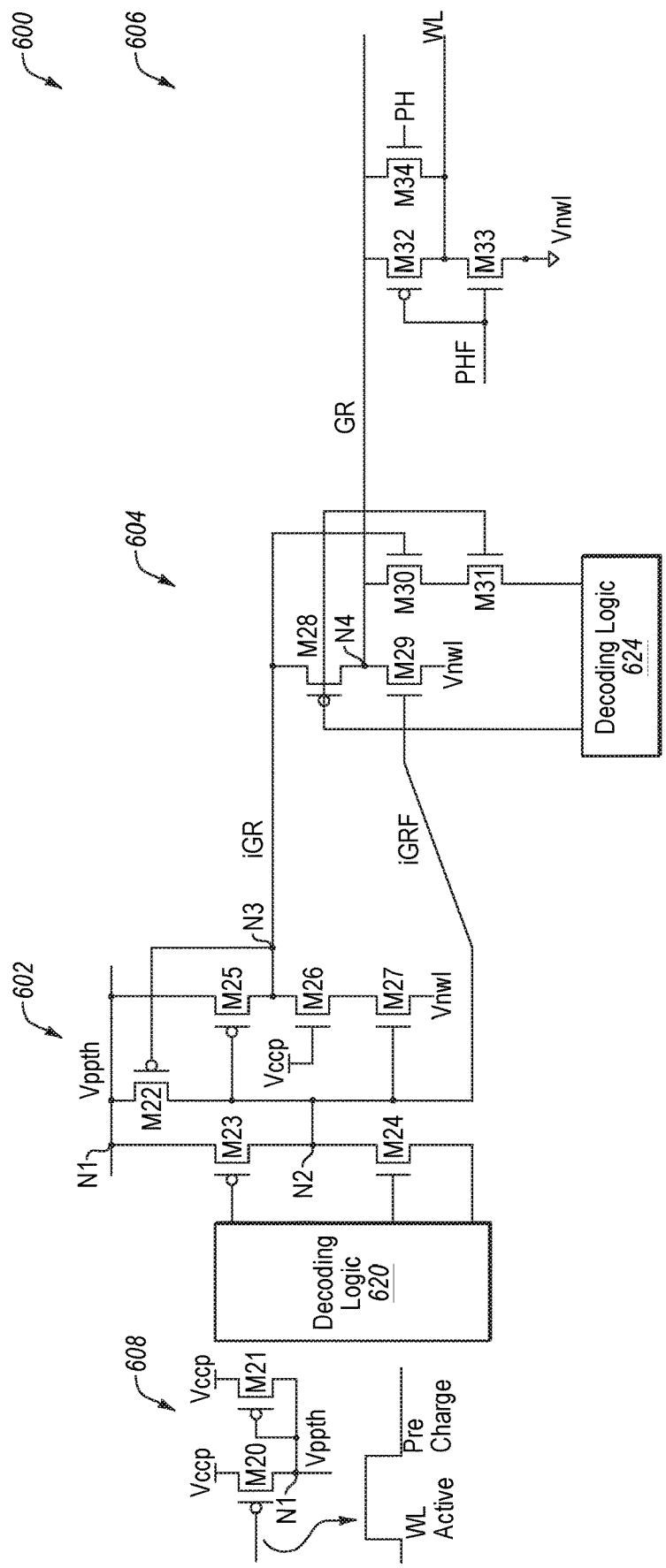
FIG. 6 depicts an example word line driver circuit, according to various embodiments of the present disclosure.

FIG. 6 illustrates a word line driver circuit 600, according to various embodiments of the present disclosure. As illustrated, word line driver circuit 600 including a pre-decoder 602, a main word line driver 604, and a sub word line driver 606. Word line driver circuit 600 further includes a supply voltage generation circuit 608 for generating voltage Vppth. Word line driver circuit 600 may also be referred to herein as "word line driver circuitry" or simply "driver circuitry." In some embodiments, pre-decoder 602 may include supply voltage generation circuit 608. In other embodiments, supply voltage generation circuit 608 may be external to pre-decoder 602. In either of these embodiments, pre-decoder 602 and supply voltage generation circuit 608 collectively may be referred to herein as a "circuit." Further, for example, sub word line driver 606 may include sub word line driver 502 of FIG. 5A.

It will appreciated that although FIG. 6 illustrates word line driver circuit 600 having one pre-decoder, one main word line driver, and one sub word line driver, word line driver circuit 600 may include a number of a pre-decoders, a number of main word line drivers, and a number of sub word line driver. For example, each pre-decoder may be configured to convey a signal (e.g., an internal global word line voltage) to one or more main word line drivers, and each main word line driver may be configured to convey a signal (e.g., a global word line voltage) to one or more sub word line drivers.

As illustrated in FIG. 6, supply voltage generation circuit 608 includes a transistor M20 (e.g., a PMOS transistor) including a drain coupled to supply voltage Vccp, a gate configured to receive a control signal, and a source coupled to a node N1. Further, supply voltage generation circuit 608 includes a transistor M21 (e.g., a PMOS transistor) including a drain coupled to supply voltage Vccp, and a gate and a source coupled to a node N1. According to some embodiments, node N1 may have a voltage Vppth. As will be appreciated, transistor M21 is configured as a diode connected transistor (i.e., for diode clamping).

As described more fully herein, during at least one mode of operation (e.g., during an active mode) of word line driver circuit 600, voltage Vppth may be a clamped voltage (also referred to herein as a "floating supply voltage" or a "floating voltage"), which may decrease due to energy leakage (i.e., that occurs in word line driver circuit 600). In other phases (e.g., standby or pre-charge phases), voltage Vppth may be a substantially fixed voltage (i.e., substantially equal to voltage Vccp).

Pre-decoder 602 includes decoding logic 620 and transistors M22-M27. For example, transistors M22, M23, and M25 may be PMOS transistors, and transistors M24, M26, and M27 may be NMOS transistors. As illustrated, gates of transistors M23 and M24 and a drain of transistor M24 are coupled to decoding logic 620, a drain of transistor M23 is coupled to node N1, and a source of transistor M23 and a source of transistor M24 are coupled together at a node N2. Further, a source of transistor M22, a gate of transistor M25, and a gate of transistor M27 are coupled to node N2, and a gate of transistor M26 is coupled to voltage Vccp. A drain of transistor M22 and a drain of transistor M25 are coupled to node N1, a source of transistor M25 is coupled to a source of transistor M26 at a node N3, a drain of transistor M26 is coupled to a source of transistor M27, and a drain of transistor M27 is coupled to negative word line voltage Vnw1. Pre-decoder 602 is configured to generate an internal global word line voltage iGR at node N3 and an internal global word line voltage iGRF (i.e., complement of internal global word line voltage iGR) at node N2 based on voltage Vppth.

Main word line driver 604 includes decoding logic 624 and transistors M28-M31. For example, transistor M28 may be a PMOS transistor, and transistors M29-M31 may be NMOS transistors. As illustrated, a gate of transistor M28 is coupled to decoding logic 624, a drain of transistor M28 is coupled to node N3, and a source of transistor M28 is coupled to a node N4. Further, a gate of transistor M29 is coupled to node N2, a source of transistor M29 is coupled to node N4, and a drain of transistor M29 is coupled to voltage Vnw1. Moreover, a source of transistor M30 is coupled to node N4, a gate of transistor M30 is coupled to node N3, and a drain of transistor M30 is coupled to a source of transistor M31. Further, gate of transistor M31 and a drain of transistor M31 are coupled to decoding logic 624. Main word line driver 604 is configured to generate a global word line voltage GR at node N4 based on global word line voltage iGR and internal global word line voltage iGRF.

Sub word line driver 606 includes transistors M32-M34. For example, transistor M32 is a PMOS transistor, and transistors M33 and M34 are NMOS transistors. In this example, a drain of transistor M32 is configured to receive global word line voltage GR, a source of transistor M32 is coupled to a word line WL, and a gate of transistor M32 is configured to receive a phase signal PHF. Further, a source of transistor M33 is coupled to word line WL, a drain of transistor M33 is configured to receive negative word line voltage Vnw1 (e.g., 0.2 volts), and a gate of transistor M33 is configured to receive phase signal PHF. Further, a source of transistor M34 is coupled to global word line voltage GR, a drain of transistor M34 is coupled to word line WL, and a gate of transistor M34 is configured to receive a phase signal PH (i.e., complement of phase signal PHF).

As will be appreciated, during a pre-charge phase, transistor M20 may be ON and a node N1 may be charged to voltage Vccp. Further, during an active mode (e.g., when an active signal is asserted after a pre-charge), the control signal received at the gate of transistor M20 of supply voltage generation circuit 608 may be high, and thus transistor M20, which is a PMOS transistor in this example, may be OFF. Further, after a pre-charge and at least a beginning of an active mode, node N1 may include a voltage equal to voltage Vccp. However, in this example, transistor M21 may be OFF, node N1 is clamped (i.e., there is no forcing voltage), and therefore supply voltage Vppth is clamped. Accordingly, during the active phase (e.g., assuming a duration of the active phase is long enough), voltage Vppth may decrease from a value of voltage Vccp to a value of Vccp−Vt, wherein Vt is a threshold voltage of transistor M21. Whether or not supply voltage Vppth decreases, and possibly a rate at which supply voltage Vppth decreases, may depend on various factors, as described more fully below. Further, in response to voltage Vppth decreasing to Vccp−Vt, transistor M21 may begin to turn ON. Thus, in these embodiments, voltage Vppth may not decrease to a value less than Vccp−Vt. In other words, voltage Vppth may be clamped between voltage Vccp and voltage Vccp−Vt.

According to some embodiments, the decrease of voltage Vppth may be due to energy leakage occurring in word line driver circuit 600. More specifically, according to some embodiments, energy leakage may occur due to current leakage in one or more transistors of word line driver circuit 600 and/or leakage in one or memory cells coupled to an active word line (e.g., word line WL when sub word line driver 606 is active (i.e., selected)). Yet more specifically, for example, energy leakage may occur due current leakage in one or more non-conducting transistors of word line driver circuit 600 and/or leakage in one or memory cells coupled to an active word line.

Thus, in contrast to conventional system or devices, in an active mode, a voltage (e.g., a high, activation voltage) conveyed to a sub word line driver and/or a voltage generated via the sub word line driver may decrease to a level less than a supply voltage (e.g., less than supply voltage Vccp). More specifically, the voltage (e.g., a high, activation voltage) conveyed to a sub word line driver and/or a voltage generated via the sub word line driver may decrease to Vccp−Vt (e.g., 3.3−0.7). Whether or not the voltage decreases, and possibly a rate at which the voltage decreases, may depend on various factors, such as timing (e.g., a duration of an active state), amount of energy leakage, and/or other factors).

Further, the gates of transistors M32 and M33 of sub word line driver 606 are not configured to receive a global word line voltage, and thus any GIDL, compared to conventional devices or systems, may be reduced, and possibly eliminated. Also, in contrast to conventional systems or devices, diode clamping (i.e., via transistor M21) may occur during the active mode.

Figure 7:
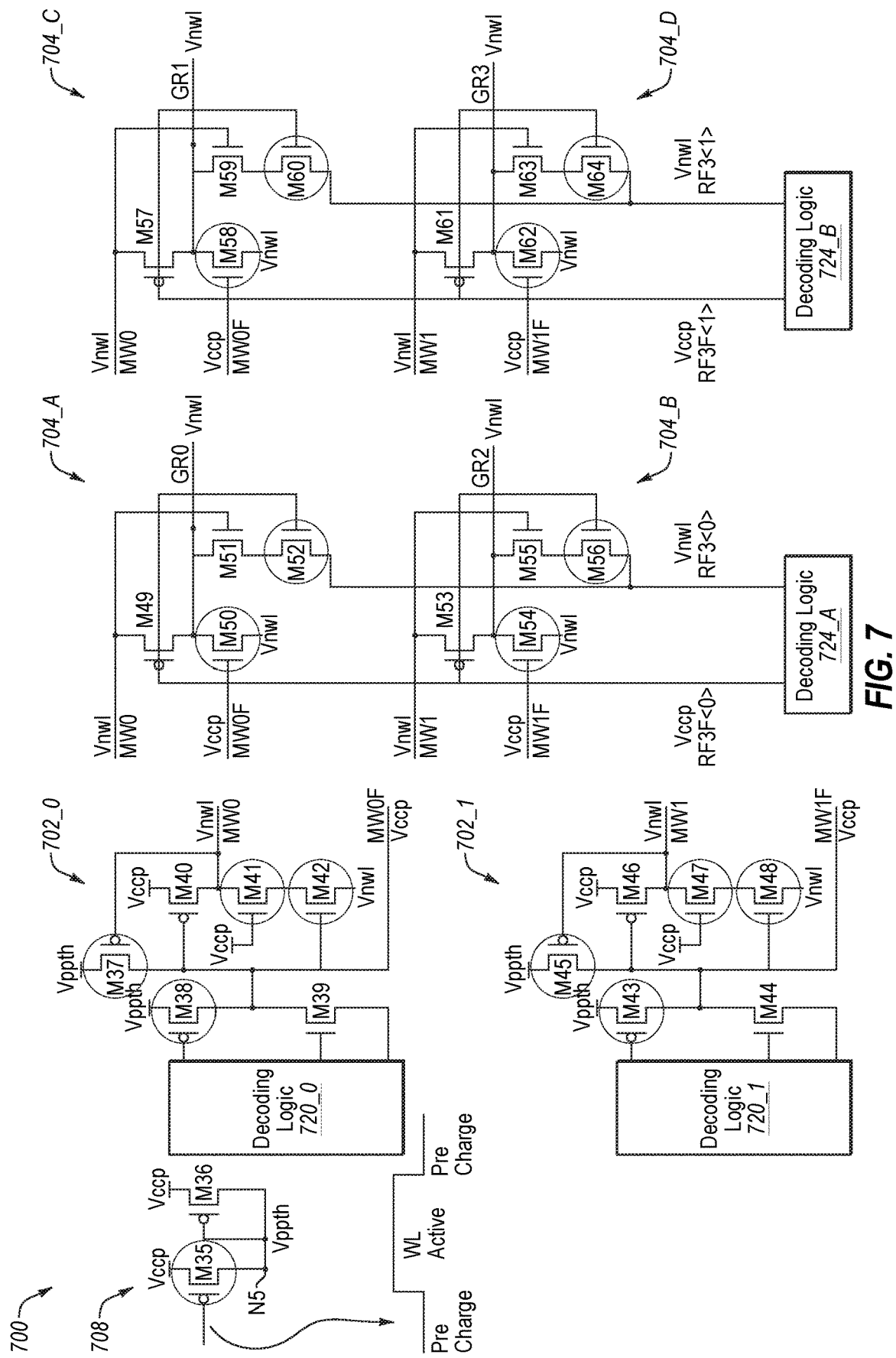
FIG. 7 illustrates an example word line driver circuit operating in a standby mode, in accordance with various embodiments of the present disclosure.

FIG. 7 illustrates a word line driver circuit 700 in a standby mode, in accordance with various embodiments of the present disclosure. Word line driver circuit 700 includes pre-decoder circuitry including a pre-decoder 702_0 and a pre-decoder 702_1. Word line driver circuit 700 further includes main word line driver circuitry including a main word line driver 704_A, a main word line driver 704_B, a main word line driver 704_C, a main word line driver 704_D, decoding logic 724_A, and decoding logic 724_B. Word line driver circuit 700 further includes a supply voltage generation circuit 708. In some embodiments, supply voltage generation circuit 708 may be part of the pre-decoder circuitry. In other embodiments, supply voltage generation circuit 708 may be external to the pre-decoder circuitry.

As illustrated, supply voltage generation circuit 708, which includes transistors M35 and M36, is configured to receive supply voltage Vccp and a control signal (i.e., an active signal or a pre-charge signal), and generate voltage Vppth. Similar to supply voltage generation circuit 608 (see FIG. 6), depending on the received control signal, voltage Vppth generated via supply voltage generation circuit 708 may be a clamped voltage or a fixed voltage. More specifically, according to some embodiments, if the received control signal is an active command, voltage Vppth may be a clamped voltage. Otherwise, if the received control signal is a pre-charge command, voltage Vppth may be a fixed voltage.

Pre-decoder 702_0 includes decoding logic 720_0 and transistors M37-M42, and pre-decoder 702_1 includes decoding logic 720_1 and transistors M43-M48. Each of pre-decoder 702_0 and pre-decoder 702_1 are configured similar to pre-decoder 602 shown in FIG. 6.

Word line driver 704_A includes transistors M49-M52, word line driver 704_B includes transistors M53-M56, word line driver 704_C includes transistors M57-M60, and word line driver 704_D includes transistors M61-M64. Word line driver 704_A and word line driver 704_B are configured to receive signals (e.g., voltage Vccp and/or voltage Vnw1) from decoding logic 724_A, and word line driver 704_C and word line driver 704_D are configured to receive signals (e.g., voltage Vccp and/or voltage Vnw1) from decoding logic 724_B. Each of word line driver 704_A, word line driver 704_B, word line driver 704_C, and word line driver 704_D are configured similar to pre-decoder 602 shown in FIG. 6.

As noted above, FIG. 7 depicts word line driver circuit 700 in a standby mode. In a standby mode, the control signal, which may include a pre-charge command, received at the gate of transistor M35 of supply voltage generation circuit 708 is low, and thus transistor M35 is ON and a node N5 is coupled to voltage Vccp. Therefore, in a standby mode, voltage Vppth has a fixed value. In other words, during the standby mode, voltage Vppth is a fixed supply voltage.

Further, during a contemplated operation, while operating in the standby mode, transistors M37, M38, M41, and M42 of pre-decoder 702_0 are ON, transistors M39 and M40 of pre-decoder 702_0 are OFF, and pre-decoder 702_0 generates internal global word line signals MW0 and MW0F, which are voltage Vnw1 and voltage Vccp, respectively. Similarly, while operating in the standby mode, transistors M43, M45, M47, and M48 of pre-decoder 702_1 are ON, transistors M44 and M46 of pre-decoder 702_1 are OFF, and pre-decoder 702_1 generates internal global word line signals MW1 and MW1F, which are voltage Vnw1 and voltage Vccp, respectively.

Internal global word line signals MW0 and MW0F may be received at main word line driver 704_A and main word line driver 704_C. Further, internal global word line signals MW1 and MW1F may be received at main word line driver 704_B and main word line driver 704_D. Main word line drivers 704_A and 704_B also receive control signals RF3F<0> and RF3<0> from decoding logic 724_A. In this example, control signal RF3F<0> is voltage Vccp and control signal RF3<0> is voltage Vnw1. Moreover, main word line drivers 704_C and 704_D also receive control signals RF3F<1> and RF3<1> from decoding logic 724_B. In this example, control signal RF3F<1> is voltage Vccp and control signal RF3<1> is voltage Vnw1.

Furthermore, while operating in the standby mode, transistors M50 and M52 of word line driver 704_A are ON, transistors M49 and M51 of word line driver 704_A are OFF, and word line driver 704_A generates global word line signal GR0, which is voltage Vnw1. Further, transistors M54 and M56 of word line driver 704_B are ON, transistors M53 and M55 of word line driver 704_B are OFF, and word line driver 704_B generates global word line signal GR2, which is voltage Vnw1. Moreover, transistors M58 and M60 of word line driver 704_C are ON, transistors M57 and M59 of word line driver 704_C are OFF, and word line driver 704_C generates global word line signal GR1, which is voltage Vnw1. Further, transistors M62 and M64 of word line driver 704_D are ON, transistors M61 and M63 of word line driver 704_D are OFF, and word line driver 704_D generates global word line voltage GR3, which is voltage Vnw1.

Figure 8:
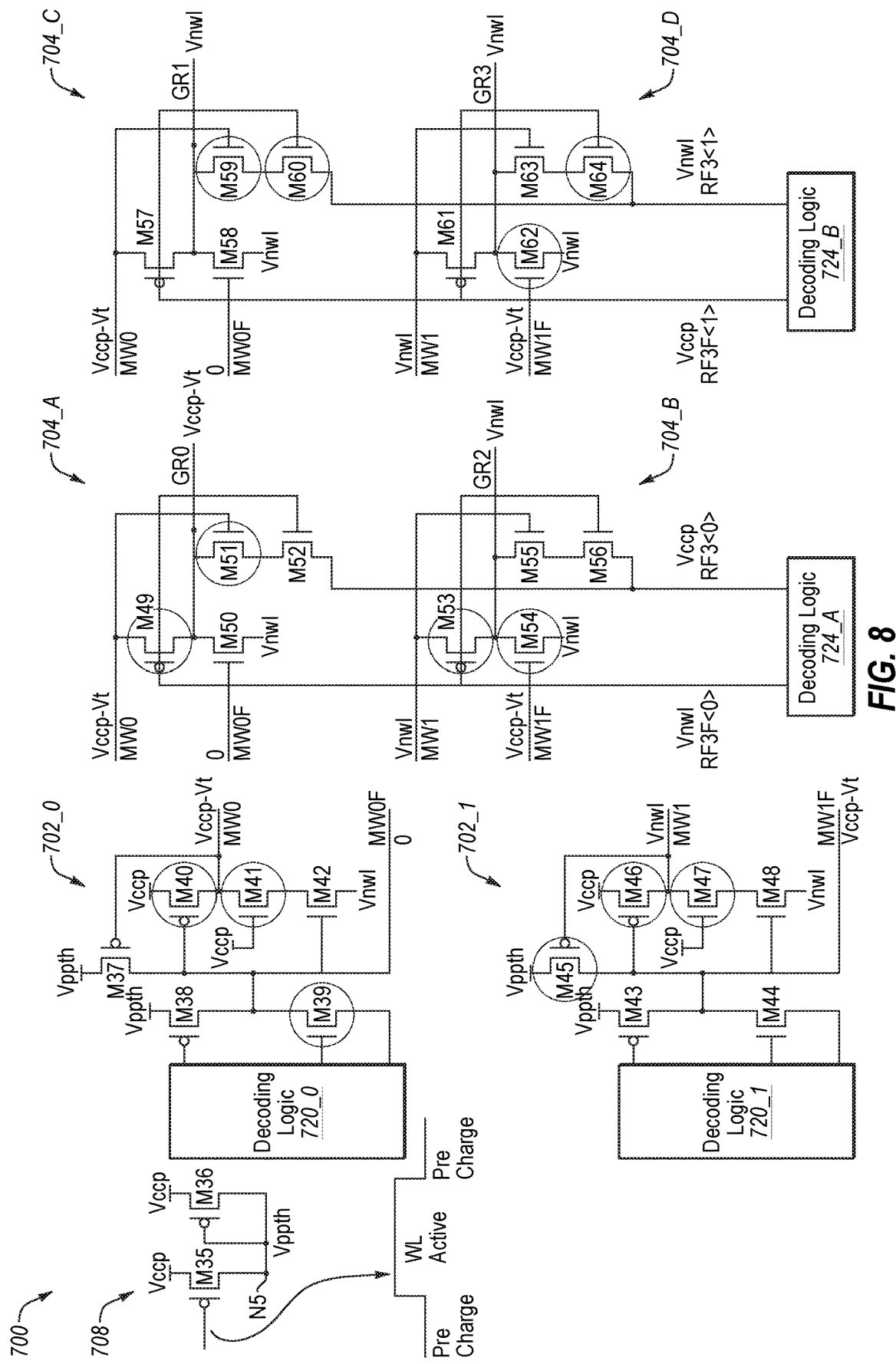
FIG. 8 illustrates an example word line driver circuit operating in an active mode, in accordance with various embodiments of the present disclosure.

FIG. 8 illustrates word line driver circuit 700 in an active mode (also referred to herein as an "active phase" or "active period"), in accordance with various embodiments of the present disclosure. In an active mode, the control signal, which may include an active command, received at the gate of transistor M35 of activation circuit is high, transistor M35 is OFF, and a node N5 is clamped. Therefore, in the active mode, voltage Vppth is a clamped voltage (also referred to as a "floating supply voltage" or a "floating voltage").

Further, during a contemplated operation, while operating in the active mode, transistors M39, M40, and M41 of pre-decoder 702_0 are ON, transistors M38 and M42 of pre-decoder 702_0 are OFF, and pre-decoder 702_0 generates internal global word line signals MW0 and MW0F, which are Vccp-Vt and 0 volts, respectively. Similarly, while operating in the active mode, transistors M45, M46, and M47 of pre-decoder 702_1 are ON, transistors M43 and M44 of pre-decoder 702_1 are OFF, and pre-decoder 702_1 generates internal global word line signals MW1 and MW1F, which are voltage Vnw1 (e.g., −0.2) and Vccp-Vt, respectively.

Internal global word line signals MW0 and MW0F may be received at main word line driver 704_A and main word line driver 704_C. Further, internal global word line signals MW1 and MW1F may be received at main word line driver 704_B and main word line driver 704_D. Main word line drivers 704_A and 704_B also receive control signals RF3F<0> and RF3<0> from decoding logic 724_A. In this example, control signal RF3F<0> is voltage Vnw1 and control signal RF3<0> is voltage Vccp. Moreover, main word line drivers 704_C and 704_D also receive control signals RF3F<1> and RF3<1> from decoding logic 724_B. In this example, control signal RF3F<1> is voltage Vccp and control signal RF3<1> is voltage Vnw1.

Furthermore, while operating in the active mode, transistors M49 and M51 of word line driver 704_A are ON, transistors M50 and M52 of word line driver 704_A are OFF, and word line driver 704_A generates global word line signal GR0, which is Vccp-Vt. Further, transistors M53 and M54 of word line driver 704_B are ON, transistors M55 and M56 of word line driver 704_B are OFF, and word line driver 704_B generates global word line signal GR2, which is voltage Vnw1. Moreover, transistors M59 and M60 of word line driver 704_C are ON, transistors M57 and 58 of word line driver 704_C are OFF, and word line driver 704_C generates global word line signal GR1, which is voltage Vnw1. Further, transistors M62 and M64 of word line driver 704_D are ON, transistors M61 and M63 of word line driver 704_D are OFF, and word line driver 704_D generates global word line voltage GR3, which is voltage Vnw1.

According to some embodiments, in an active mode, energy leakage may occur due to current leakage in one or more transistors of word line driver circuit 700 and/or leakage in one or memory cells coupled to an active word line. Yet more specifically, for example, in an active mode (e.g., as shown in FIG. 8), energy leakage may occur due to current leakage in one or more non-conducting transistors of word line driver circuit 700 and/or leakage in one or memory cells coupled to an active word line. Yet more specifically, for example, during active mode wherein word line driver 704_A is selected (e.g., as shown in FIG. 8), energy leakage may occur due to current leakage in one or more transistors M38, M43, M57, and M61. Alternatively or additionally, leakage associated with one or more unselected sub word line drivers (e.g., sub word line driver 504 of FIG. 5A) and/or leakage associated one or more memory cells coupled to an active word line (e.g., active word line WL0 of FIG. 5A) may occur. As will be appreciated, energy leakage may contribute to a reduction of one or more word line voltages (e.g., internal global word line voltages MW0, MW1F, and/or global world line voltage GR0) of word line driver circuit 700 during an active mode. More specifically, due to energy leakage occurring during an active mode of word line driver circuit 700, global word line voltages MW0, MW1F and global world line voltage GR0 may decrease from voltage Vccp to voltage Vccp-Vt (i.e., assuming the active mode has a sufficient duration).

Figure 9:
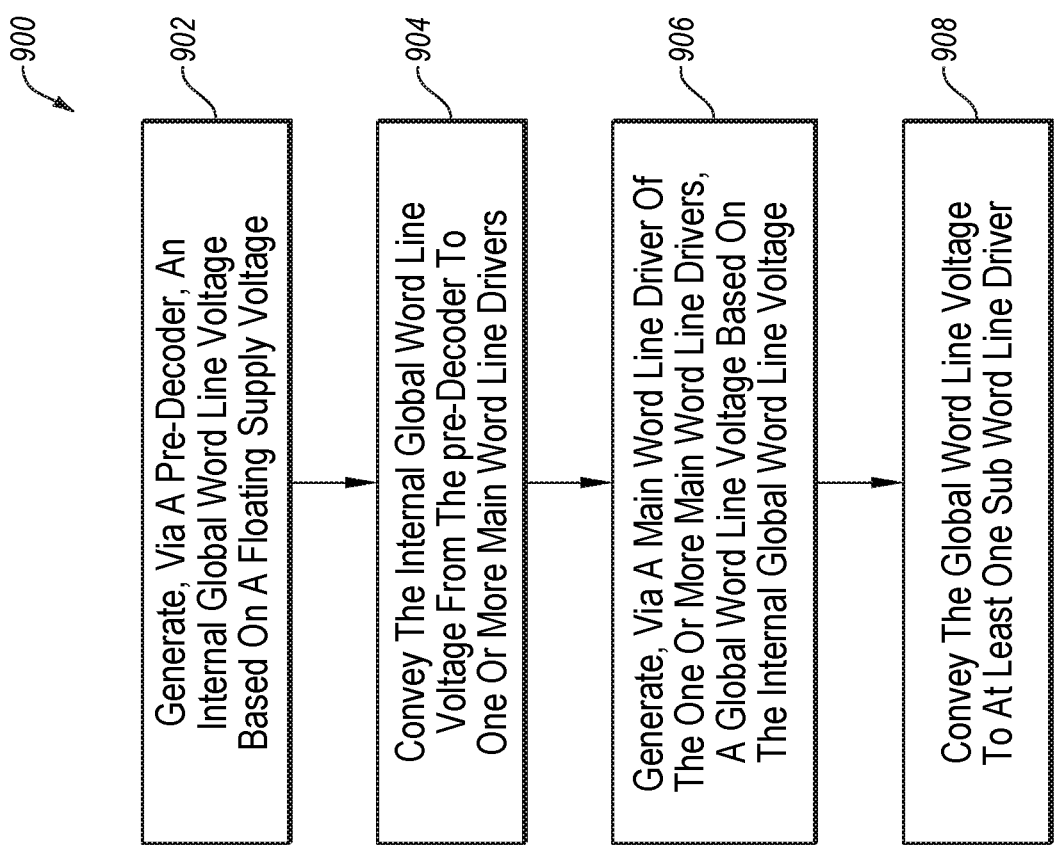
FIG. 9 is a flowchart of an example method of operating a memory device, in accordance with various embodiments of the present disclosure.

FIG. 9 is a flowchart of an example method 900 of operating a memory device, in accordance with various embodiments of the disclosure. Method 900 may be arranged in accordance with at least one embodiment described in the present disclosure. Method 900 may be performed, in some embodiments, by a device or system, such as memory device 100 of FIG. 1, driver control circuitry 210 of FIG. 2, word line driver 208 of FIG. 2, sub word line driver 500 of FIG. 5A, word line driver circuit 600 of FIG. 6, word line driver circuit 700 of FIGS. 7 and 8, memory device 1000 of FIG. 10, and/or system 1100 of FIG. 11, or another device or system. Although illustrated as discrete blocks, various blocks may be divided into additional blocks, combined into fewer blocks, or eliminated, depending on the desired implementation.

Method 900 may begin at block 902, wherein an internal global word line voltage may be generated based on a clamped voltage, and method 900 may proceed to block 904. For example, during an active mode (e.g., in response to an active command), internal global word line voltage iGR (see FIG. 6) may be generated (i.e., via pre-decoder 602) based on supply voltage Vppth, which may be a clamped voltage during the active mode.

At block 904, the internal global word line voltage may be conveyed to one or more main word line drivers, and block 904 may proceed to block 906. For example, with reference to FIG. 6, internal global word line voltage iGR may be conveyed to main word line driver 604. As another example, with reference to FIG. 7, internal global word line voltage MW0 may be conveyed to main word line drivers 704_A and 704_C, and internal global word line voltage MW1 may be conveyed to main word line drivers 704_B and 704_D.

At block 906, a global word line voltage may be generated based on the internal global word line voltage, and method 900 may proceed to block 908. For example, the global word line may be generated via a main word line driver. More specifically, with reference to FIG. 6, main word line driver 604 may generate global word line voltage GR. As another example, with reference to FIG. 7, main word line driver 704_A may generate global word line voltage GR0.

At block 908, the global word line voltage may be conveyed to at least one sub word line driver. For example, with reference to FIG. 6, global word line voltage GR may be conveyed from main word line driver 604 to sub word line driver 606. More specifically, for example, global word line voltage GR may be conveyed from main word line driver 604 to a drain and/or a source of one or more transistors of sub word line driver 606.

Modifications, additions, or omissions may be made to method 900 without departing from the scope of the present disclosure. For example, the operations of method 900 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include an act wherein a word line voltage (e.g., word line voltage WL in FIG. 6) may be generated based on the global word line voltage. As another example, a method may include an act wherein an internal global word line voltage (e.g., internal global word line voltage iGR of FIG. 6) may be generated based on fixed supply voltage during a pre-charge mode.

A memory device is also disclosed. According to various embodiments, the memory device may include one or more memory cell arrays, such as memory cell array 102 (see FIG. 1). The one or more memory cell arrays may include a number of memory cells.

Figure 10:
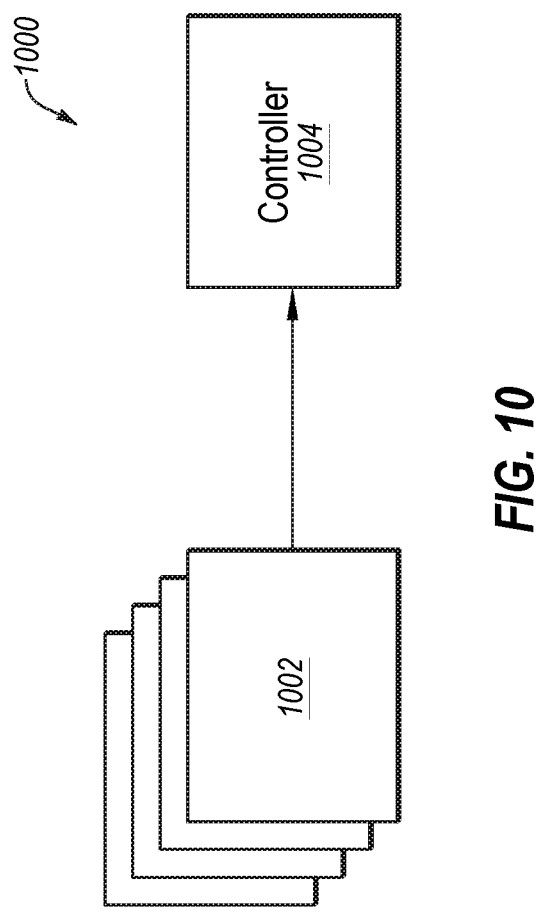
FIG. 10 is a simplified block diagram of a memory device, in accordance with various embodiments of the present disclosure.

FIG. 10 is a simplified block diagram of a memory device 1000 implemented according to one or more embodiments described herein. Memory device 1000, which may include, for example, a semiconductor device, includes a memory array 1002 and a controller 1004. Memory array 1002, which may include a number of memory banks, may include a number of memory cells.

Controller 1004 may be operatively coupled with memory array 1002 so as to read, write, or refresh any or all memory cells within memory array 1002. Controller 1004 may be configured for carrying out one or more embodiments disclosed herein. For example, in some embodiments, controller 1004, which may include, for example, driver control circuitry 210 of FIG. 2, word line driver 208 of FIG. 2, sub word line driver 500 of FIG. 5A, word line driver circuit 600 of FIG. 6, and/or word line driver circuit 700 of FIGS. 7 and 8, may be configured to generate and/or drive one or more voltages based on a clamped voltage (e.g., during an active mode), in accordance with various embodiments disclosed herein. Further, driver control circuitry 210 of FIG. 2, word line driver 208 of FIG. 2, sub word line driver 500 of FIG. 5A, word line driver circuit 600 of FIG. 6, and/or word line driver circuit 700 of FIGS. 7 and 8, may be configured to generate and/or drive one or more voltages based on a fixed supply voltage (e.g., during a pre-charge mode), in accordance with various embodiments disclosed herein.

A system is also disclosed. According to various embodiments, the system may include a memory device including a number of memory banks, each memory bank having an array of memory cells. Each memory cell may include an access transistor and a storage element operably coupled with the access transistor.

Figure 11:
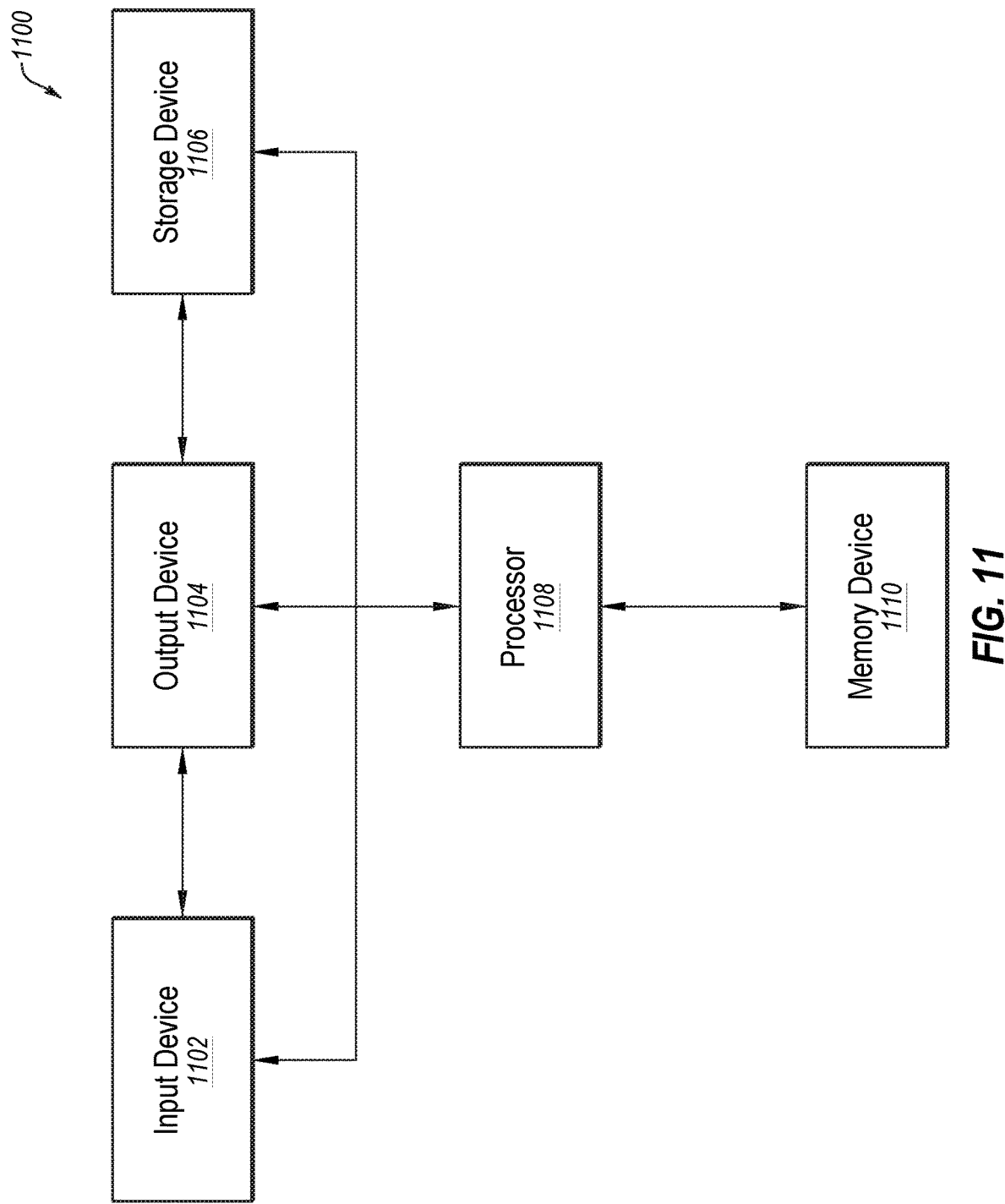
FIG. 11 is a simplified block diagram of an electronic system, in accordance with various embodiments of the present disclosure.

FIG. 11 is a simplified block diagram of an electronic system 1100 implemented according to one or more embodiments described herein. Electronic system 1100 includes at least one input device 1102, which may include, for example, a keyboard, a mouse, or a touch screen. Electronic system 1100 further includes at least one output device 1104, such as a monitor, a touch screen, or a speaker. Input device 1102 and output device 1104 are not necessarily separable from one another. Electronic system 1100 further includes a storage device 1106. Input device 1102, output device 1104, and storage device 1106 may be coupled to a processor 1108. Electronic system 1100 further includes a memory device 1110 coupled to processor 1108. Memory device 1110, which may include memory device 1000 of FIG. 10, may include an array of memory cells. Electronic system 1100 may include, for example, a computing, processing, industrial, or consumer product. For example, without limitation, system 1100 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the present disclosure may include a word line driver circuit. The word line driver circuit may include a circuit configured to generate a clamped voltage based on a first fixed supply voltage and in response to receipt of a first control signal triggering an active mode. The circuit may also be configured to generate an internal global word line voltage based on the clamped voltage during the active mode. The word line driver circuit may further include at least one word line driver configured to receive the internal global word line voltage and generate a global word line voltage. Also, the word line driver circuit may include at least one sub word line driver configured to receive the global word line voltage and generate a word line voltage.

One or more other embodiments of the present disclosure include a method of operating a memory device. The method may include generating, via a pre-decoder, an internal global word line voltage based on a clamped voltage. The method may also include conveying the internal global word line voltage from the pre-decoder to one or more main word line drivers. Further, the method may include generating, via a main word line driver of the one or more main word line drivers, a global word line voltage based on the internal global word line voltage. In addition, the method may include conveying the global word line voltage to at least one sub word line driver.

Some embodiments of the present disclosure include a memory device. The memory device may include a word line driver circuit configured to generate, during an active mode, an internal global word line voltage based on a clamped voltage. Further, the word line driver circuit may be configured to generate, during the active mode, a global word line voltage based on the internal global word line voltage. Moreover, the word line driver circuit may be configured to generate, during the active mode, a word line voltage based on the global word line voltage.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and comprising a word line driver circuit. The word line driver circuit may include a supply voltage generation circuit including a first number of transistors and configured to generate a clamped voltage in response to an active command. The word line driver circuit may further include a pre-decoder including a second number of transistors and configured to generate an internal global word line voltage based on the clamped voltage. Further, the word line driver circuit may include a number of main word line drivers, wherein each main word line driver includes a third number of transistors and is configured to receive the internal global word line voltage and generate a global word line voltage.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A word line driver circuit, comprising:
    a circuit configured to:
        generate a clamped voltage based on a first fixed supply voltage and in response to receipt of a control signal triggering an active mode; and
        generate an internal global word line voltage based on the clamped voltage during the active mode;
    at least one main word line driver configured to receive the internal global word line voltage and generate a global word line voltage; and
    at least one sub word line driver configured to receive the global word line voltage and generate a word line voltage;
    wherein energy leakage decreases the clamped voltage during the active mode.

2. The word line driver circuit of claim 1, wherein the circuit is further configured to:
    generate a second fixed supply voltage substantially equal to the first fixed supply voltage in response to receipt of a second, different control signal including a pre-charge command triggering a pre-charge mode; and
    generate the internal global word line voltage based on the second fixed supply voltage during the pre-charge mode.

3. The word line driver circuit of claim 1, wherein the control signal includes an active control signal to activate a main word line driver of the at least one main word line driver.

4. The word line driver circuit of claim 1, wherein the circuit comprises a supply voltage generation circuit, the supply voltage generation circuit comprising:

a first transistor having a gate configured to receive the control signal, a drain coupled to the first fixed supply voltage, and a source coupled to a first node; and
a second transistor having a gate coupled to the first node, a drain coupled to the first fixed supply voltage, and a source coupled to the first node.

5. The word line driver circuit of claim 4, wherein each of the first transistor and the second transistor comprise a P-type metal-oxide-semiconductor (PMOS) transistor.

6. The word line driver circuit of claim 1, wherein each main word line driver of the at least one main word line driver comprises:
a first transistor having a gate coupled to decoding logic, a drain configured to receive the internal global word line voltage, and a source coupled to a first node;
a second transistor having a gate configured to receive another internal global word line voltage, a source coupled to the first node, and a drain configured to receive a negative word line voltage;
a third transistor having a gate configured to receive the internal global word line voltage and a source coupled to the first node; and
a fourth transistor having a gate and a drain coupled to decoding logic and a source coupled to a drain of the third transistor.

7. The word line driver circuit of claim 1, wherein each sub word line driver of the at least one sub word line driver comprises:
a first transistor having a drain configured to receive the global word line voltage, a source coupled to a first word line; and a gate terminal configured to receive a first phase signal;
a second transistor having a source configured to receive the global word line voltage,
a drain coupled to a word line, and a gate terminal configured to receive a second phase signal; and
a third transistor having a source coupled to the word line, a drain coupled to a negative word line voltage, and a gate configured to receive the first phase signal.

8. The word line driver circuit of claim 7, wherein the first transistor comprises a P-type metal-oxide-semiconductor (PMOS) transistor, and each of the second transistor and the third transistor comprise a N-type metal-oxide-semiconductor (NMOS) transistor.

9. A method of operating a memory device, comprising:
generating, via a pre-decoder, an internal global word line voltage based on a clamped voltage;
conveying the internal global word line voltage from the pre-decoder to one or more main word line drivers;
generating, via a main word line driver of the one or more main word line drivers, a global word line voltage based on the internal global word line voltage; and
conveying the global word line voltage to at least one sub word line driver, wherein energy leakage decreases the clamped voltage during an active mode.

10. The method of claim 9, further comprising:
charging a node with a supply voltage in response to a first control signal including an pre-charge command; and
generating the clamped voltage at the node in response to receipt of a second, different control signal including an active command.

11. The method of claim 10, further comprising coupling the node to the supply voltage via a transistor in response to the clamped voltage decreasing to a value equal to the supply voltage minus a threshold voltage of the transistor.

12. The method of claim 9, wherein conveying the global word line voltage to at least one sub word line driver comprises conveying the global word line voltage to one of a drain and a source of a transistor of a sub word line driver of the at least one sub word line driver.

13. The method of claim 9, further comprising:
generating, based on the global word line voltage, a word line voltage via a sub word line driver of the at least one sub word line driver; and
conveying, via the sub word line driver, the word line voltage to at least one memory cell.

14. A memory device, comprising:
a word line driver circuit configured to:
generate, during a row active mode, an internal global word line voltage based on a clamped voltage;
generate, during the row active mode, a global word line voltage based on the internal global word line voltage; and
generate, during the row active mode, a word line voltage based on the global word line voltage, wherein the clamped voltage decreases due to energy leakage during the row active mode.

15. The memory device of claim 14, wherein the word line driver circuit is further configured to:
generate, during a pre-charge mode, a second internal global word line voltage based on a fixed supply voltage;
generate, during the pre-charge mode, a second global word line voltage based on the second internal global word line voltage; and
generate, during the pre-charge mode, a second word line voltage based on the second global word line voltage.

16. The memory device of claim 14, wherein the word line driver circuit is further configured to generate the clamped voltage based on a fixed supply voltage and in response to receipt of a control signal triggering an active mode.

17. An electronic system comprising:
at least one input device;
at least one output device;
at least one processor device operably coupled to the input device and the output device; and
at least one memory device operably coupled to the at least one processor device and comprising a word line driver circuit, the word line driver circuit comprising:
a supply voltage generation circuit including a first number of transistors and configured to generate a clamped voltage in response to an active command;
a pre-decoder including a second number of transistors and configured to generate an internal global word line voltage based on the clamped voltage; and
a number of main word line drivers, each main word line driver including a third number of transistors and configured to receive the internal global word line voltage and generate a global word line voltage, wherein energy leakage in the word line driver circuit decreases the clamped voltage during an active mode.

18. The electronic system of claim 17, wherein each of the internal global word line voltage and the global word line voltage decreases in response to energy leakage in or more transistors of at least one of second number of transistors and the third number of transistors.

19. The electronic system of claim 17, further comprising a number of sub word line drivers, each sub word line driver including a fourth number of transistors and configured to receive the global word line voltage and generate a word line voltage.

20. The word line driver circuit of claim 1, wherein the circuit is further configured to generate a substantially fixed voltage based on the first fixed supply voltage during a standby or precharge mode.

* * * * *

UNITED STATES PATENT AND TRADEMARK OFFICE
CERTIFICATE OF CORRECTION

PATENT NO. : 11,270,746 B2  
APPLICATION NO. : 16/548242  
DATED : March 8, 2022  
INVENTOR(S) : Tae H. Kim Page 1 of 2

It is certified that error appears in the above-identified patent and that said Letters Patent is hereby corrected as shown below:

In the Specification

| | | |
|---|---|---|
| Column 2, | Line 50, | change "and/BL" to --and /BL-- |
| Column 2, | Line 52, | change "and/BL" to --and /BL-- |
| Column 2, | Line 54, | change "and/BL" to --and /BL-- |
| Column 2, | Line 60, | change "and/BL" to --and /BL-- |
| Column 2, | Line 61, | change "or/BL" to --or /BL-- |
| Column 3, | Line 3, | change "or/BL" to --or /BL-- |
| Column 3, | Line 50, | change "and/CK" to --and /CK-- |
| Column 5, | Line 29, | change "Vnw1" to --Vnwl-- |
| Column 5, | Line 33, | change "Vnw1" to --Vnwl-- |
| Column 5, | Line 41, | change "Vnw1" to --Vnwl-- |
| Column 6, | Line 24, | change "Vnw1" to --Vnwl-- |
| Column 6, | Line 38, | change "Vnw1" to --Vnwl-- |
| Column 8, | Line 37, | change "Vnw1" to --Vnwl-- |
| Column 8, | Line 51, | change "Vnw1" to --Vnwl-- |
| Column 9, | Line 1, | change "Vnw1" to --Vnwl-- |
| Column 10, | Line 34, | change "Vnw1" to --Vnwl-- |
| Column 10, | Line 37, | change "Vnw1" to --Vnwl-- |
| Column 10, | Line 56, | change "Vnw1" to --Vnwl-- |
| Column 10, | Line 61, | change "Vnw1" to --Vnwl-- |
| Column 11, | Line 4, | change "Vnw1" to --Vnwl-- |
| Column 11, | Line 8, | change "Vnw1" to --Vnwl-- |
| Column 11, | Line 13, | change "Vnw1" to --Vnwl-- |
| Column 11, | Line 17, | change "Vnw1" to --Vnwl-- |
| Column 11, | Line 21, | change "Vnw1" to --Vnwl-- |
| Column 11, | Line 25, | change "Vnw1" to --Vnwl-- |
| Column 11, | Line 45, | change "Vnw1" to --Vnwl-- |
| Column 11, | Line 54, | change "Vnw1" to --Vnwl-- |
| Column 11, | Line 59, | change "Vnw1" to --Vnwl-- |

Signed and Sealed this  
Twenty-sixth Day of April, 2022

Katherine Kelly Vidal  
*Director of the United States Patent and Trademark Office*

CERTIFICATE OF CORRECTION (continued)
U.S. Pat. No. 11,270,746 B2

Column 12,    Line 1,    change "Vnw1" to --Vnwl--
    Column 12,    Line 5,    change "Vnw1" to --Vnwl--
    Column 12,    Line 8,    change "Vnw1" to --Vnwl--